(12) United States Patent
Terai et al.

(10) Patent No.: US 9,543,252 B2
(45) Date of Patent: Jan. 10, 2017

(54) SEMICONDUCTOR APPARATUS AND METHOD FOR PRODUCING THE SAME

(75) Inventors: Mamoru Terai, Chiyoda-ku (JP); Shiori Idaka, Chiyoda-ku (JP); Kei Yamamoto, Chiyoda-ku (JP); Yoshiyuki Nakaki, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/412,778

(22) PCT Filed: Jul. 11, 2012

(86) PCT No.: PCT/JP2012/004470
§ 371 (c)(1),
(2), (4) Date: Jan. 5, 2015

(87) PCT Pub. No.: WO2014/009996
PCT Pub. Date: Jan. 16, 2014

(65) Prior Publication Data
US 2015/0171026 A1 Jun. 18, 2015

(51) Int. Cl.
*H01L 23/00* (2006.01)
*H01L 23/495* (2006.01)
(Continued)

(52) U.S. Cl.
CPC ............ *H01L 23/562* (2013.01); *H01L 21/56* (2013.01); *H01L 21/78* (2013.01); *H01L 23/293* (2013.01);
(Continued)

(58) Field of Classification Search
CPC .. H01L 23/562; H01L 23/293; H01L 23/3107; H01L 23/3171; H01L 23/3185; H01L 23/3736; H01L 23/4334; H01L 23/3135; H01L 21/56; H01L 21/78; H01L 24/03; H01L 24/05; H01L 24/29; H01L 24/32; H01L 24/45; H01L 24/48; H01L 24/73; H01L 29/1608
See application file for complete search history.

(56) References Cited

U.S. PATENT DOCUMENTS 6,379,999 B1   4/2002 Tanabe
2007/0037376 A1*  2/2007 Okamoto ............ H01L 23/3128
                                            438/612
(Continued)

FOREIGN PATENT DOCUMENTS

JP   2-63148 A   3/1990
JP   2 308557   12/1990
(Continued)

OTHER PUBLICATIONS

Translation of JP2011228336.*
(Continued)

*Primary Examiner* — Whitney T Moore
(74) *Attorney, Agent, or Firm* — Oblon, McClelland, Maier & Neustadt, L.L.P.

(57) ABSTRACT

A plurality of semiconductor devices provided on a silicon carbide substrate are provided with electrode layers, respectively. The silicon carbide substrate is cut at a region of an exposed surface of the silicon carbide substrate that separates the electrode layers to individually separate the semiconductor devices. A stress relaxation resin is applied to each individually separated semiconductor device to cover the exposed surface at a peripheral end portion of that surface of the semiconductor device which has the electrode layer thereon. A semiconductor apparatus can thus be obtained that also allows a semiconductor device with a silicon carbide or similar compound semiconductor substrate to adhere to a sealant resin via large adhesive strength (Continued)

and thus allows the sealant resin to be less crackable, less peelable and the like by thermal stress caused in operation.

14 Claims, 4 Drawing Sheets

(51) Int. Cl.
  H01L 23/29 (2006.01)
  H01L 23/373 (2006.01)
  H01L 21/56 (2006.01)
  H01L 21/78 (2006.01)
  H01L 29/16 (2006.01)
  H01L 23/31 (2006.01)
  H01L 23/433 (2006.01)
  H01L 25/07 (2006.01)
(52) U.S. Cl.
  CPC ....... H01L 23/3107 (2013.01); H01L 23/3171 (2013.01); H01L 23/3185 (2013.01); H01L 23/3736 (2013.01); H01L 23/4334 (2013.01); H01L 23/49579 (2013.01); H01L 24/03 (2013.01); H01L 24/05 (2013.01); H01L 29/1608 (2013.01); H01L 23/3135 (2013.01); H01L 24/29 (2013.01); H01L 24/32 (2013.01); H01L 24/45 (2013.01); H01L 24/48 (2013.01); H01L 24/73 (2013.01); H01L 25/072 (2013.01); H01L 2224/02166 (2013.01); H01L 2224/0382 (2013.01); H01L 2224/04042 (2013.01); H01L 2224/05553 (2013.01); H01L 2224/29101 (2013.01); H01L 2224/32245 (2013.01); H01L 2224/45014 (2013.01); H01L 2224/45124 (2013.01); H01L 2224/45139 (2013.01); H01L 2224/45147 (2013.01); H01L 2224/4847 (2013.01); H01L 2224/48091 (2013.01); H01L 2224/48137 (2013.01); H01L 2224/48247 (2013.01); H01L 2224/73265 (2013.01); H01L 2924/10272 (2013.01); H01L 2924/12032 (2013.01); H01L 2924/12042 (2013.01); H01L 2924/1305 (2013.01); H01L 2924/1306 (2013.01); H01L 2924/13055 (2013.01); H01L 2924/13091 (2013.01); H01L 2924/15787 (2013.01); H01L 2924/181 (2013.01); H01L 2924/351 (2013.01)

(56) References Cited

U.S. PATENT DOCUMENTS

2007/0246833 A1* 10/2007 Soga .................. H01L 23/24
  257/772
2015/0130028 A1* 5/2015 Asano .................. H01L 23/562
  257/620

FOREIGN PATENT DOCUMENTS

| JP | 2000 269166 | 9/2000 |
| JP | 2006 313775 | 11/2006 |
| JP | 2008 518445 | 5/2008 |
| JP | 2011 14605 | 1/2011 |
| JP | 4675146 B2 | 2/2011 |
| JP | 2011 216564 | 10/2011 |
| JP | 2011 228336 | 11/2011 |
| JP | 2012 49347 | 3/2012 |

OTHER PUBLICATIONS

Translation of JP2000269166.*
Office Action issued Jan. 20, 2015 in Japanese Patent Application No. 2014-524495 (with English language translation).
International Search Report Issued Sep. 18, 2012 in PCT/JP12/004470 Filed Jul. 11, 2012.
Japanese Office Action Issued Aug. 19, 2014 in Japanese Application 2014-524495 Filed Aug. 8, 2014 (with English translation).
Office Action issued Aug. 30, 2016 in Chinese Patent Application No. 201280074596.9 (with English translation).

* cited by examiner

SEMICONDUCTOR APPARATUS AND METHOD FOR PRODUCING THE SAME

TECHNICAL FIELD

The present invention relates to a method for producing a semiconductor apparatus having a power semiconductor device used to control electric power.

BACKGROUND ART

A semiconductor apparatus that employs a power semiconductors device includes that having a semiconductor device sealed with epoxy resin or a similar thermosetting resin, i.e., a mold sealed type, and that having a semiconductor device sealed with gelated resin, i.e., a gel sealed type. In particular, the mold sealed semiconductor apparatus is small in size and excellent in reliability, and handleable, and it is thus used widely for controlling air conditioners and the like. Furthermore, in recent years, it is also used to control an automobile's motive power to drive a motor.

Normally, a semiconductor device is produced as follows: a large number of semiconductor devices provided on a semiconducting crystal substrate (hereinafter referred to as a semiconductor substrate) are diced into individual pieces (or chips). A semiconductor device receiving high voltage exceeding several hundreds volts for operation, seeks insulation between an upper electrode pad serving as a major electrode and a metal frame's side, and accordingly, the upper electrode pad is surrounded by an insulating film formed of a resin material. Note, however, that the semiconductor devices are diced with a dicing blade, and to avoid clogging the dicing blade, the insulating layer is not provided in the dicing region. The semiconductor device is bonded to the metal frame, and thereafter wired and sealed with thermosetting resin, and a semiconductor apparatus is thus completed.

When the above semiconductor apparatus is in operation, the semiconductor device generates heat, which causes thermal stress between the semiconductor device and the sealant resin. This thermal stress is caused as the semiconductor chip and the sealant resin have their respective coefficients of thermal expansion with a difference therebetween, and the thermal stress is also caused as the sealant resin sets and thus shrinks. Normally, the semiconductor device is a square semiconductor chip and has four corners with their ends experiencing maximum stress, and accordingly, may have the four corners defectively peeled off at an adhesive interface.

A conventional semiconductor apparatus has a semiconductor chip exposed in a dicing region covered with a silane based resin film to allow the chip to adhere to a sealant resin via enhanced adhesive strength.

CITATION LIST

Patent Document

PTD 1: Japanese Patent Laying-Open No. 2-308557

SUMMARY OF INVENTION

Technical Problem

A silicon carbide (SiC) semiconductor device fabricated with SiC crystal serving as a substrate has been diligently studied and as a result it has been found that SiC crystal has a surface which does not facilitate depositing a silane based resin film thereon and that if the film is deposited, it has only a small effect in allowing the SiC semiconductor device to closely adhere to the sealant resin. This is because it is believed that for example the SiC substrate's surface is less helpful in depositing an oxide film layer than Si and does not have many OH groups thereon combinable with a silane coupling agent.

The present invention has been made in order to address the above issue, and it contemplates a semiconductor apparatus that also allows a SiC semiconductor device to adhere to a sealant resin via large adhesive strength and thus allows the sealant resin to be less crackable and less peelable by thermal stress caused in operation.

Solution to Problem

The present invention provides a method for producing a semiconductor apparatus, comprising the steps of: providing electrode layers to a plurality of semiconductor devices, respectively, provided on a silicon carbide substrate; cutting the silicon carbide substrate at a region of an exposed surface of the silicon carbide substrate that separates the electrode layers on a single plane to individually separate the semiconductor devices; applying a stress relaxation resin to each individually separated semiconductor device to cover the exposed surface therewith at a peripheral end portion of that surface of the semiconductor device which has the electrode layer thereon; connecting a lead member to the electrode layer; and applying a sealant resin to seal the semiconductor device covered with the stress relaxation resin.

Advantageous Effect of Invention

The semiconductor apparatus can have a semiconductor device covered with a sealant resin less peelable and less crackable by thermal stress caused in operation, and the semiconductor apparatus can thus be enhanced in reliability.

DESCRIPTION OF EMBODIMENTS

First Embodiment

Figure 1:
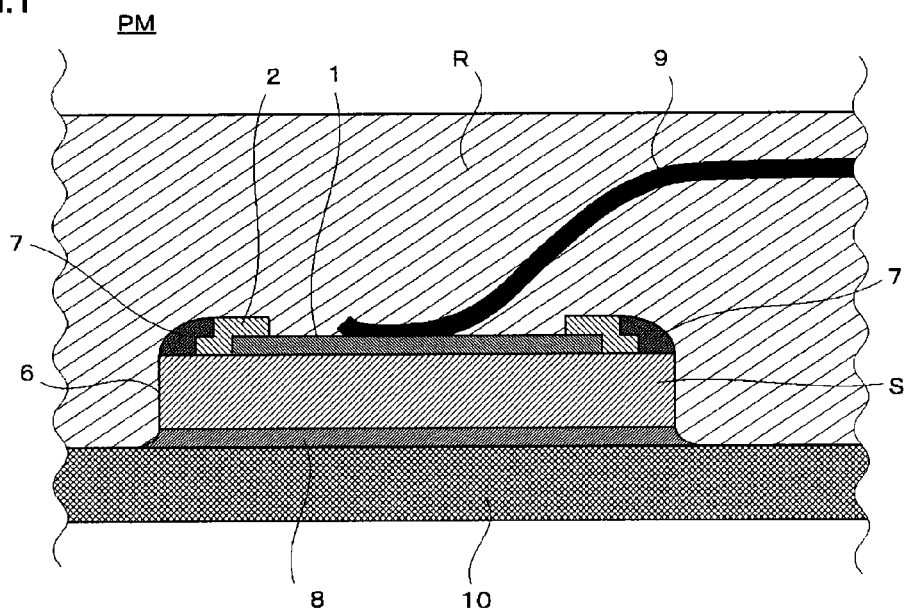
FIG. 1 is a cross section of an exemplary structure of a semiconductor apparatus of a first embodiment of the present invention.

FIG. 1 is a cross section of a major portion of an exemplary structure of a semiconductor apparatus PM of a first embodiment. A semiconductor substrate S of SiC is provided with a major electrode 1 having a peripheral end portion covered with an insulating layer 2. Semiconductor substrate S has a peripheral end portion covered with a covering layer 7. Normally, semiconductor substrate S has an outermost surface formed of an epitaxially grown layer and major electrode 1 is provided on the epitaxial layer. Semiconductor substrate S, major electrode 1, insulating layer 2, and covering layer 7 configure a semiconductor device. Covering layer 7 contains polyimide resin or polyamide resin as a major component and is provided to relax stress for a sealant resin, as will be described later. Major electrode 1 is an electrode for conducting a major current for the semiconductor device, and it is distinguished from a controlling gate electrode and the like. The semiconductor device has semiconductor substrate S secured to an electrically conductive member 10 via a bonding material 8 and has major electrode 1 with a lead member 9 bonded thereto.

Electrically conductive member 10 is disposed to face a surface of semiconductor substrate S that is opposite to the surface of semiconductor substrate S that bears major electrode 1 thereon, and more specifically, it is a member containing copper as a major component and also serving as a heat spreader, a lead frame, or the like. This semiconductor device is a power semiconductor device for controlling electric power and has a back electrode (not shown) on that side of semiconductor substrate S adjacent to bonding material 8. The semiconductor device is protected by being sealed by a sealant resin R containing as a major component an epoxy resin including filler particles, and is used as semiconductor apparatus PM.

Figure 2:
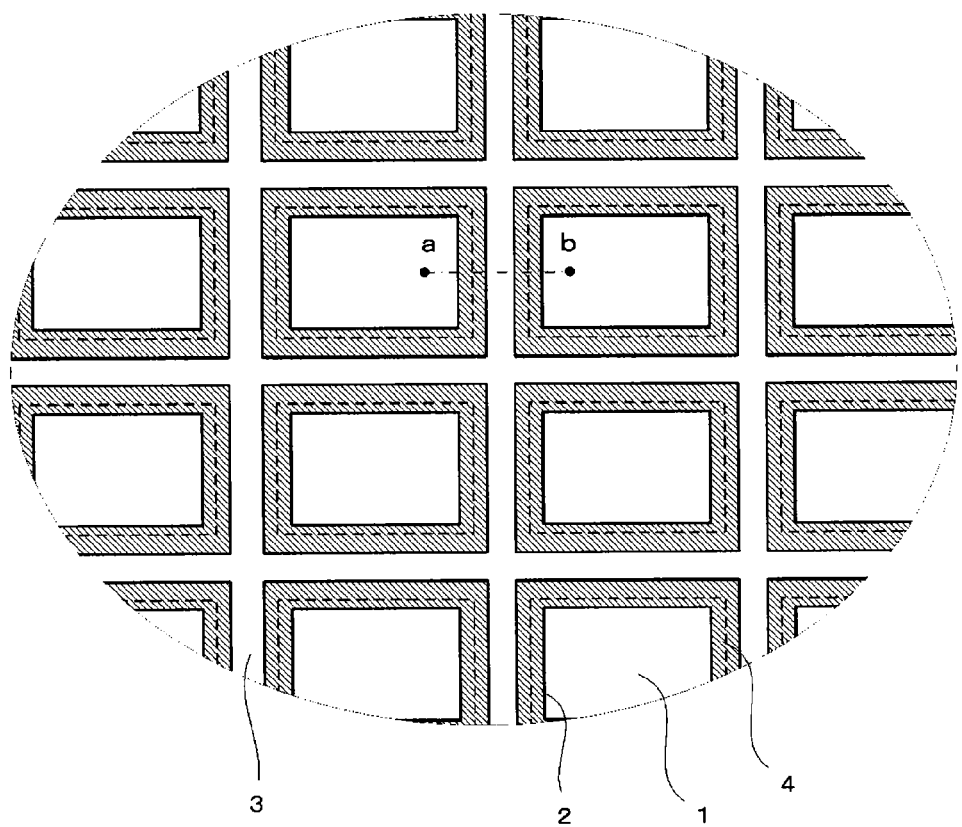
FIG. 2 is an enlarged plan view of a semiconductor substrate at a stage with a semiconductor device portion provided according to the first embodiment of the present invention.

FIG. 2 is an enlarged plan view of semiconductor substrate S of silicon carbide that has undergone the step of providing a plurality of semiconductor devices with major electrode 1 in the form of a layer or film. A large number of semiconductor devices are fabricated on a semiconductor wafer within a region delimited to include major electrode 1 and insulating layer 2 covering a peripheral portion of major electrode 1. Each semiconductor device has major electrode 1 and insulating layer 2 separated from those of the other semiconductor devices by a dicing region 3, and within that region, semiconductor substrate S is diced. Dicing region 3 is not provided with insulating layer 2 and is instead an exposed surface region exposing the epitaxial layer or semiconductor substrate S.

Figure 3:
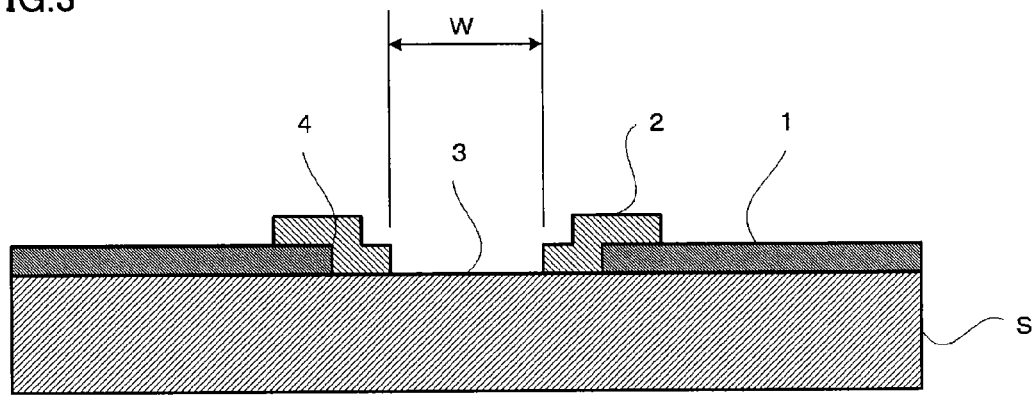
FIG. 3 is an enlarged cross section of a semiconductor substrate at a stage with a semiconductor device portion provided according to the first embodiment of the present invention.

FIG. 3 is an enlarged cross section schematically showing semiconductor substrate S with a semiconductor device in a cross section taken along a line segment ab shown in FIG. 2. Major electrode 1 has a peripheral end portion 4 covered with insulating layer 2. Dicing region 3 has a width W selected within a range of approximately 50-150 μm.

Figure 4:
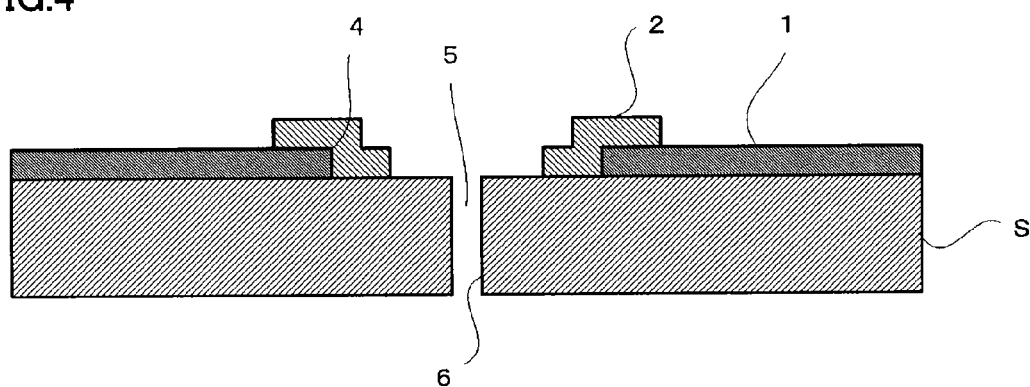
FIG. 4 is an enlarged cross section of the semiconductor device at a stage with the semiconductor substrate diced according to the first embodiment of the present invention.

FIG. 4 is an enlarged cross section of a peripheral end portion of the semiconductor device at a stage having undergone the step of dicing and thus cutting semiconductor substrate S. The dicing step is performed in all dicing regions 3 shown in FIG. 3 and as a result semiconductor devices are cut off along a dicing line 5 to be individually separated semiconductor devices. The dicing provides a section 6, which may have a trace of the cutting.

Each individually separated semiconductor device can individually be subjected to an operation test. The semiconductor device, having insulating layer 2, allows high voltage to be actually applied thereto to confirm whether it satisfies dielectric strength as required. If the semiconductor device does not have a characteristic satisfying a criterion, it is rejected.

Figure 5:
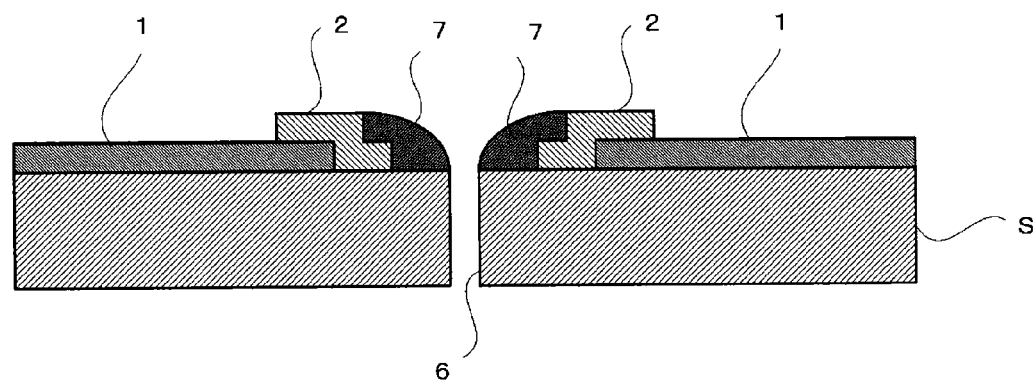
FIG. 5 is an enlarged cross section of a peripheral end portion of the semiconductor device of the first embodiment of the present invention.

FIG. 5 is an enlarged cross section of the semiconductor device with the peripheral end portion provided with covering layer 7. Covering layer 7 covers an exposed surface region of semiconductor substrate S that remains at a periphery of the semiconductor device. Covering layer 7 covers the semiconductor device's peripheral end portion entirely, and it is a stress relaxation resin layer for sealant resin R.

Note that the semiconductor device experiences largest thermal stress at its four corners, and accordingly, if the semiconductor device peels, in most cases it peels first at the four corners and then toward its inner region. Thus, a covering layer only covering the four corners and a region in a vicinity thereof is sufficient to provide a semiconductor apparatus resistant to initial peeling. The thus limited covered region allows a coating step to be simplified to achieve higher productivity.

Note that FIG. 5 shows two semiconductor devices adjacently. This assumes that, before the dicing step is performed, a dicing tape is stuck on a back surface of semiconductor substrate S, and the semiconductor devices are diced with a blade without cutting the dicing tape so that the semiconductor devices remain on the dicing tape. The semiconductor devices that are secured on the dicing tape are easy to handle in providing the semiconductor devices with covering layer 7. Alternatively, the diced semiconductor devices may be bonded to a frame or a similar member and thus provided with covering layer 7.

The mold-sealed semiconductor apparatus is fabricated in a process as follows: initially, a solder or a similar bonding material is used to bond a semiconductor device to electrically conductive member 10. Electrically conductive member 10 is a metallic member, and it may be a lead frame in the form of a thin plate and may alternatively be a metallic plate also serving as a heat spreader. Subsequently, a lead member is connected to the semiconductor device at an upper electrode pad. The lead member is formed of a metallic thin wire, a metallic ribbon, a metallic thin plate, or the like. The lead member is connected by bonding the metallic thin wire, the metallic ribbon or the like ultrasonically or by bonding the metallic thin plate via solder or a similar bonding material. Each lead member is connected to a lead terminal portion associated therewith to form a circuit including the semiconductor device. After the lead member is connected, sealant resin R is used to perform a sealing (or molding) step to produce the semiconductor apparatus. The sealing step is suitably performed by pressure molding via transfer molding, and the sealing step may alternatively be performed by potting to introduce the sealant resin in the form of liquid.

The dicing step described above is performed as follows: a blade formed with powdery diamond bound via metal is rapidly rotated to mechanically dice semiconductor devices, i.e., blade-dicing, or laser light is used to utilize fusion, ablation, thermal cutting, polycrystalization or a similar phenomenon to dice semiconductor devices, i.e., laser-dicing.

If dicing region 3 is covered with insulating layer 2 of resin, the blade-dicing may clog the blade. The clogged blade is chippable in the cutting operation and thus results in significantly poor productivity. A SiC substrate is large in hardness, and accordingly, the SiC substrate must be cut with a blade having a high abrasive grain density and thus more easily clogs the blade than a silicon (Si) substrate does.

Furthermore, the laser-dicing that provides polycrystalization is prevented by insulating layer 2 on dicing region 3 from converging laser light. In the first embodiment, dicing region 3 does not have insulating layer 2 and thus allows the dicing step to proceed smoothly.

Dicing region 3 is provided to be larger in width than dicing line 5 with a tolerance considered for the dicing step, and this results in the semiconductor device having the semiconductor substrate exposed in a region outer than insulating layer 2. Sealing the semiconductor device with resin in that condition provides an interface of a surface of semiconductor and the resin in directly contact with each other. SiC, GaN (gallium nitride) and other similar semiconductors have coefficients of thermal expansion that are significantly different from those of epoxy resin and other similar sealing resins, and their adhesive interface thus experiences large thermal stress.

When the semiconductor device is in operation it attains high temperature, whereas when it is not in operation it has low temperature, and as it alternately, repeatedly attains the high and low temperatures, it has an adhesive interface gradually destroyed. Semiconductor substrate S experiences maximal thermal stress at an end thereof, and accordingly, normally, it initially has the end peeled, and as it repeatedly experiences thermal stress, it has stress concentration gradually moved from the peeled end to another location and is thus further peeled.

Furthermore, an experiment through a heat cycle test has revealed that when semiconductor substrates of Si and SiC have their ends uncoated, the SiC substrate peels several times faster than the Si substrate. This is because it is believed that the Si substrate has a surface of Si, which facilitates generating native oxide, whereas the SiC's surface does not allow native oxide to be substantially made and epoxy resin and SiC thus adhere together via small adhesive strength.

A power semiconductor device with SiC, GaN or the like serving as semiconductor substrate S is also operable at high temperature exceeding 150° C. and it is also required to operate in a resin-sealed module at high temperature close to 200° C. The semiconductor device operated at higher temperature is, however, accompanied by temperature varying in a wider range and hence larger thermal stress and thus has a surface that adheres to the sealant resin severely peeled off. The semiconductor device thus has a peripheral portion having an interface with the sealant resin micro-cracked, peeled off and/or the like while the semiconductor device is operated less frequently, and the semiconductor device is observed to have a semiconductor chip with a wiring deformed, damaged and/or the like.

In the present embodiment, a SiC substrate having a peripheral portion with SiC exposed has the peripheral portion coated with covering layer 7 of polyimide based resin or polyamide based resin to cover the portion having SiC exposed. As a result, after it is sealed the substrate has an end that is an interface of SiC and the covering layer and an interface of the covering layer and the sealant resin. When this configuration was used, a peeling rate (i.e., length of peel developed/cycle count) was observed that was significantly smaller than that of an interface of SiC and the sealant resin in direct contact with each other. Covering layer 7 can be electrostatically applied, dispensed, ink-jetted, or the like. When covering layer 7 is applied, placing semiconductor substrate S with the major electrode facing downward, and disposing an injection nozzle under semiconductor substrate S to thus spray resin upward allow the resin's gravity to work to ensure that semiconductor substrate S has an end slightly larger in thickness. Furthermore, applying covering layer 7 to the semiconductor device only at the four corners allows an increased throughput.

Note that providing covering layer 7 after the semiconductor device is bonded to electrically conductive member 10 and then has the lead member connected thereto makes it difficult to provide covering layer 7 in a region overlapping the lead member.

For example, if a liquid resin material is sprayed to the semiconductor device or the semiconductor device is dipped into the liquid resin material, it would be difficult to control covering layer 7 to fall within an optimal range in thickness or be uniform in thickness and quality. Variation in thickness is directly linked to variation in reliability, and the above manner would industrially be unsuitable.

Normally, insulating layer 2 is also suitably formed of polyimide based resin or polyamide based resin, and insulating layer 2 and covering layer 7 may be identical in material. In that case, covering layer 7 can be formed with resin having a larger solid content than insulating layer 2. A coating of liquid having a high solid content can prevent the semiconductor device from having a peripheral end having a layer excessively smaller in thickness. For example, a covering layer uninterruptedly increasing in thickness from the peripheral end, that has a thickness equal to or larger than 8 μm at a location 30 μm away from the peripheral end, can effectively prevent the sealant resin from increasingly peeling.

Figure 6:
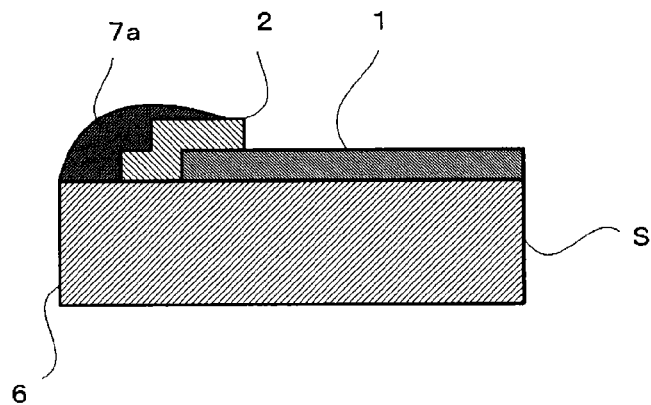
FIG. 6 is an enlarged cross section of a peripheral end portion of the semiconductor device of the first embodiment of the present invention.

Note that covering layer 7 is positionally not limited to the manner shown in FIG. 5. FIG. 6 is an enlarged cross section of the peripheral end portion of the semiconductor device of the first embodiment with covering layer 7 also reaching an upper side of insulating layer 2. Insulating layer 2 and covering layer 7 may not be identical in material, as resins have coefficients of thermal expansion with a small difference therebetween and they are less likely to increasingly peel off. Accordingly, a semiconductor apparatus that employs the semiconductor device of FIG. 6 can have substantially the same function and effect as the semiconductor apparatus in the manner of FIG. 5.

According to the first embodiment, a power semiconductor device with semiconductor substrate S of SiC or the like that has undergone an individual test using high voltage and a highly productive dicing step can also provide a semiconductor apparatus allowing a sealant resin to exhibit large adhesive strength to allow the semiconductor apparatus to be repeatedly operated excellently reliably. Furthermore, when covering layer 7 is formed of significantly insulating polyimide resin or the like, it allows the semiconductor device to be more insulative.

As has previously been described, it is advisable that the semiconductor device be fabricated such that covering layer 7 is provided before the semiconductor device is bonded to electrically conductive member 10 and has lead member 9 wired thereto.

Bonding the semiconductor device to electrically conductive member 10 and thereafter providing covering layer 7 requires preventing covering layer 7 from having its insulating material adhering to a member other than the device including electrically conductive member 10.

Furthermore, first bonding lead member 9 and subsequently applying covering layer 7 would be an inappropriate approach as it would be difficult to apply covering layer 7 to a portion shadowed by lead member 9.

Note that patent document 1 discloses a semiconductor chip having four corners obliquely removed to have an inclined surface in order to distribute a portion having stress concentration and thus reduce stress. However, SiC is significantly hard (Mohs hardness: 13), and thus makes it difficult to process a chip's ends to have an inclined surface. Furthermore, when the chip is processed, it may chip and thus be impaired in reliability, and the approach is thus industrially difficult to take. Accordingly, covering layer 7 of the present invention serves as an appropriate solution to prevent the sealant resin from peeling off the semiconductor device.

Second Embodiment

Figure 7:
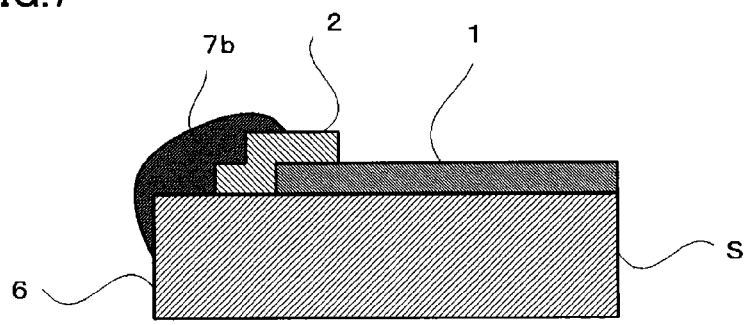
FIG. 7 is an enlarged cross section of a peripheral end portion of a semiconductor device of a second embodiment of the present invention.

FIG. 7 is an enlarged cross section of a peripheral end portion of a semiconductor device of a second embodiment with covering layer 7 also reaching section 6. Semiconductor substrate S has a chip size of a square of 3 mm squares as a minimum size, and has a thickness of approximately 100 μm to 400 μm, and accordingly, it experiences relatively small thermal stress depthwise. Accordingly, the second embodiment can provide covering layer 7 resistant to initial peeling at an adhesive interface with semiconductor substrate S and thus provide a semiconductor apparatus significantly reliable against variation in temperature.

Furthermore, an increased creepage distance can be provided from the back surface of semiconductor substrate S to major electrode 1, and the semiconductor apparatus can have large dielectric strength. Note that insulating layer 2 ensures that the semiconductor device has dielectric strength, and accordingly, it is needless to say that individually separated semiconductor devices can undergo an operation test with high voltage applied thereto.

Figure 8:
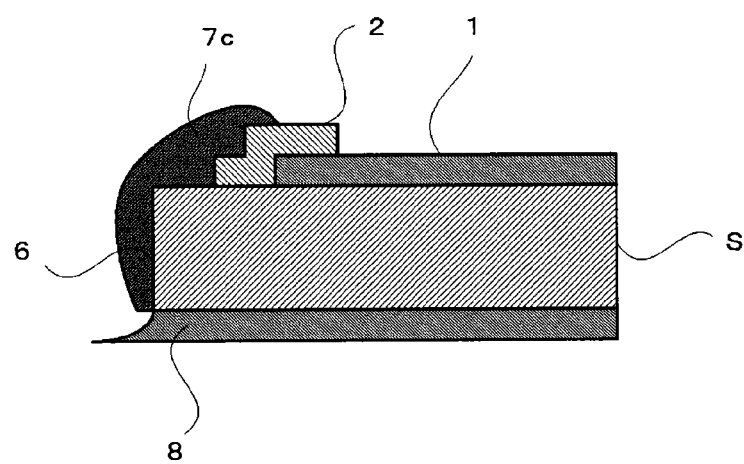
FIG. 8 is an enlarged cross section of a peripheral end portion of the semiconductor device of the second embodiment of the present invention.

FIG. 8 is an enlarged cross section of a peripheral end portion of a semiconductor device of the second embodiment with covering layer 7 covering section 6 entirely. Placing semiconductor substrate S on an appropriate pedestal in the form of a flat plate or an adhesive sheet and thus providing covering layer 7 can prevent covering layer 7 from reaching the back surface of semiconductor substrate S.

Covering layer 7 that entirely covers section 6 increases an anchoring effect provided by section 6, and a significantly reliable semiconductor apparatus can thus be provided.

EXAMPLE

Figure 9:
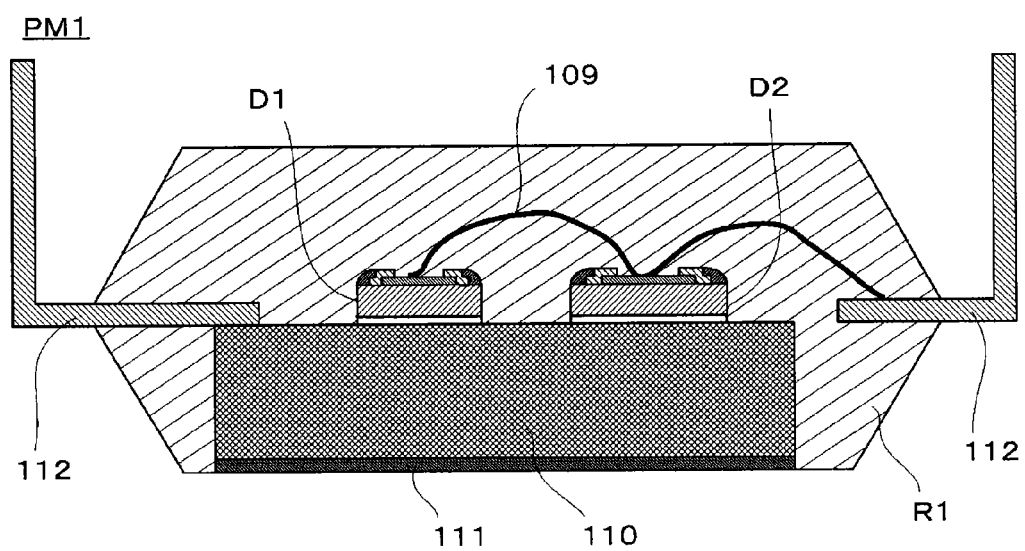
FIG. 9 is a cross section of a structure of a semiconductor apparatus of an example of the present invention.

FIG. 9 is a cross section of a structure of a semiconductor apparatus PM1 of an example of the present invention. Semiconductor apparatus PM1 is a power module with a first semiconductor device 1 and a second semiconductor device D2 connected in parallel, and has a basic configuration similar to that shown in FIG. 1. First semiconductor device 1 and second semiconductor device D2 each include a major electrode, an insulating layer, and a covering layer, and are bonded via solder, sinterable, fine metal particles, or a similar bonding material to a heat spreader 110 that is to serve as the electrically conductive member. Furthermore, semiconductor apparatus PM1 includes a lead frame 112 also serving as a terminal member for an external circuit, with a lead member that is a wire 109 of aluminum ultrasonically bonded and thus connected to semiconductor devices 1 and D2. Wire 109 has one end connected to lead frame 112. Semiconductor apparatus PM1 excluding an external terminal portion of lead frame 112 is entirely sealed with epoxy resin or a similar sealant resin R1. The sealing step is performed by transfer molding to entirely seal an assembly of the semiconductor devices having wire 109 completely connected.

Heat spreader 110 has an insulating sheet 111 stuck thereon to ensure that semiconductor apparatus PM1 is insulated. Insulating sheet 111 may be a two-layer structure of metallic foil and an insulating layer. In that case, insulating sheet 111 has the insulating layer to serve as a layer to adhere to heat spreader 110.

Semiconductor device D1, D2 mounted is for example an insulated gate bipolar transistor (IGBT), a metal oxide semiconductor field effect transistor (MOSFET) or a similar switching element, a Schottky barrier diode or a similar rectifying element, or the like. The switching element has an upper surface with a major electrode, and a control electrode aligned with the major electrode and having a lead member (not shown) connected to the control electrode for the control electrode. The MOSFET has a source electrode to serve as a major electrode, a gate electrode to serve as a control electrode, and the like. These electrodes are connected via a wire or a similar wiring member to another device, lead frame 112 or a similar terminal member, or the like to form a circuit internal to the module, and a path to communicate outside the module for feeding electric power. The lead member such as wire is suitably a member containing aluminum, and in addition thereto, significantly electrically conductive copper, silver or the like as a major component. Semiconductor devices D1 and D2 each have an insulating layer provided to electrically insulate the major electrode on the upper side of the semiconductor device and heat spreader 110, and a covering layer provided on an epitaxial layer after the semiconductor device is diced.

Thus, a so-called frame assembly having a circuit thus provided (or the semiconductor apparatus before it is sealed) is sealed with sealant resin R1 such that an end portion of lead frame 112 that serves as an outer lead portion and a metallic foil portion that serves as a radiating surface are exposed to configure semiconductor apparatus PM1.

In the present example the module is configured of members having coefficients of linear expansion, as follows: semiconductor substrate S of SiC has a coefficient of linear expansion of 3-5 ppm/K; heat spreader 110 and lead frame 112 containing copper as a major component have a coefficient of linear expansion of 17 ppm/K; and wire 109 containing aluminum as a major component has a coefficient of linear expansion of 23 ppm/K. Heat spreader 110 preferably has a thickness of 1.5-5 mm and in the present example it had a thickness of 3 mm.

The insulating sheet is formed of epoxy or a similar resin filled with an excellently thermally conducting inorganic powdery filler at a high filling rate of approximately 70 vol % in order to efficiently radiate heat generated from the semiconductor device. This provides enhanced thermal conduction to achieve a coefficient of linear expansion reduced to approximately 10-20 ppm/K.

The sealant resin has a modulus of elasticity selectable within a range of 5-30 GPa, and when its thermal stress with respect to the lead frame, the device and the like is considered, the sealant resin preferably has a modulus of elasticity of 10-15 GPa. The sealant resin preferably has a coefficient of linear expansion adjusted to fall within a range of 10-17 ppm/K when the thermal stress caused at its interface with the heat spreader is considered. In the present example a sealant resin having a coefficient of linear expansion of 13 ppm/K was employed. Note that when the electrically conductive member is an insulating substrate that is a ceramic substrate having an electrode pattern deposited thereon, the insulating substrate has a coefficient of linear expansion smaller than 10 ppm/K, and accordingly, a sealant resin having a coefficient of linear expansion of approximately 10-12 ppm/K is suitably used. The coefficient of linear expansion of approximately 10-12 ppm/K allows semiconductor substrate S to have its coefficient of linear expansion with a reduced difference therefrom so that if semiconductor devices 1 and D2 have a peripheral end portion with the SiC substrate exposed they are less likely to manifest a peeled interface.

The sealant resin, the covering resin, and the like have an insulating filler introduced therein. The insulating filler includes inorganic powder of molten silica or the like having a small coefficient of linear expansion, excellently thermally conductive alumina, and the like. It is also selectable from crystalline silica, glass, boron nitride, aluminum nitride, silicon carbide, natural minerals, and the like. The filler is selectable in particle diameter range and geometry depending on applications as required, such as coloring, viscosity adjustment, lubrication and the like, and the filler may be a plurality of types of fillers combined together.

The covering layer is preferably formed of a material that is qualitatively small in modulus of elasticity when the thermal stress caused at its adhesive interface with sealant resin R1 is considered. Accordingly, when the covering layer has a modulus of elasticity with an upper limit estimated to correspond to the modulus of elasticity of the sealant resin, a range of 10-15 GPa will serve as the upper limit. Preferably the covering layer is excellently heat-resistant polyimide based resin or polyimide-amide based resin. Furthermore, it may be formed of a plurality of types of resins mixed together or may have the aforementioned filler added thereto to have an adjusted modulus of elasticity.

Covering layer 7 is electrostatically applied, dispensed, ink-jetted, or the like to cover the SiC exposed surface. For example, when the covering layer is dispensed or ink jetted to coat a chip's SiC exposed surface, a coated area is provided as shown in FIG. 6 or 7. When the covering layer is electrostatically applied, a coated area is provided as shown in FIG. 5.

Covering layer 7 may be identical to or different from the insulating layer in material. Furthermore, to provide the coated area shown in FIG. 5, it is preferable that covering layer 7's resin has a larger solid content than the insulator's resin.

In the present example, the covering layer is formed of material with photosensitive polyimide resin (HD8930 produced by HD MicroSystems, Ltd.) and polyamide-imide resin (HL-1210N produced by Hitachi Chemical Co., Ltd.) used to adjust material, with the materials having different moduli of elasticity, as shown in table 1, used to fabricate modules to be tested. Furthermore, a module with acrylic resin serving as the covering layer was also fabricated.

Each module to be tested was coated with a covering layer, which was electrostatically applied. The covering layer is applied via an electrostatic coating device formed of an electrostatic coating nozzle, an agent supply system, a high voltage power supply, an XYZθ stage, an alignment system and the like. After each module was coated, it was baked at 100-140° C. for a several minutes to remove a solvent contained in the film, and furthermore, it was thermally set at 150-200° C. for several hours to provide the covering layer. The covering layer was set at 250° C. or below, as providing the covering layer at 250° C. or higher degrades a surface of an electrode that serves as a bonding surface for soldering, and thus results in reduced solder wettability.

Table 1 indicates the types of the resins of the covering layers of modules (1) to (8) fabricated, and a result of a reliability test. Modules (2) to (8) had their respective covering layers formed with resins having different moduli of elasticity and different breaking elongation rates. The reliability test was specifically a heat cycle test and a power cycle test.

The heat cycle test was conducted as follows: the modules were placed in a temperature controllable thermostatic oven having an internal temperature controlled to repeatedly, alternately attain −60° C. and 180° C.

The power cycle test was conducted as follows: each semiconductor device was energized to attain 200° C., and once it attained 200° C., energizing it was stopped and it was cooled to 120° C. and thereafter again energized.

Whether a semiconductor device is reliable was determined according to a criterion: whether the semiconductor device had no peeling observed after the heat cycle test was conducted for 1800 cycles and after the power cycle test was conducted for 200 k cycles.

TABLE 1

| | module nos. | | | | | | | |
|---|---|---|---|---|---|---|---|---|
| | (1) | (2) | (3) | (4) | (5) | (6) | (7) | (8) |
| (a) covering layer's resin | none | polyimide resin | | | | polyamide-imide resin | | acrylic resin |
| (a1) modulus of elasticity (GPa) | — | 10.5 | 8.0 | 2.9 | 3.6 | 10 | 1.2 | 3.3 |
| (a2) breaking elongation rate (%) | — | 30 | 60 | 80 | 9 | 30 | 40 | 7 |
| (b) heat cycle (no. of cycles for which peeling is caused) | 300 or smaller | 800 or smaller | 1800 or larger | 1800 or larger | 1000 or smaller | 800 or smaller | 1800 or larger | 700 or smaller |
| (c) power cycle (no. of cycles for which peeling is caused) | 50k | 75k | 200k or larger | 200k or larger | 100k | 80k | 200k or larger | 80k |
| (d) result | fail | fail | pass | pass | fail | fail | pass | fail |

It can be seen from table 1 that it is desirable that the covering layer have a modulus of elasticity equal to or smaller than 8 GPa. While module (5) did not satisfy the criterion, it is superior to module (2). Furthermore, a breaking elongation rate of 40% or larger is considered to be preferable.

REFERENCE SIGNS LIST

1: major electrode
2: insulating layer
3: dicing region
4: peripheral end portion
5: dicing line
6: section
7: covering layer
9: lead member
10: heat spreader
S: semiconductor substrate
R: sealant resin

The invention claimed is:

1. A method for producing a semiconductor apparatus, comprising the steps of:
   providing electrode layers to a plurality of semiconductor devices, respectively, provided on a silicon carbide substrate;
   cutting said silicon carbide substrate at a region of an exposed surface of said silicon carbide substrate without an insulating layer that separates said electrode layers on a single plane to individually separate said semiconductor devices;
   applying a stress relaxation resin to each of said individually separated semiconductor devices to cover only peripheral end portions of a surface of said semiconductor device which has said electrode layer thereon and to contact said exposed surface of said silicon carbide substrate without said insulating layer;
   connecting a lead member to said electrode layer; and
   applying a sealant resin to seal said semiconductor device covered with said stress relaxation resin.

2. The method for producing a semiconductor apparatus according to claim 1, wherein:
   said stress relaxation resin contains one of polyimide resin and polyimide-amide resin as a major component; and
   said sealant resin contains epoxy resin as a major component.

3. The method for producing a semiconductor apparatus according to claim 2, wherein the step of applying a stress relaxation resin includes the steps of:
   applying said stress relaxation resin in a form of a liquid to coat said semiconductor device therewith; and
   heating and thus setting said stress relaxation resin at a temperature equal to or lower than 250° C.

4. The method for producing a semiconductor apparatus according to claim 1, wherein said stress relaxation resin has a modulus of elasticity equal to or smaller than 8 GPa.

5. The method for producing a semiconductor apparatus according to claim 4, wherein said stress relaxation resin has a breaking elongation rate equal to or larger than 40%.

6. The method for producing a semiconductor apparatus according to claim 1, further comprising the step of applying an insulating resin to cover a peripheral portion of each said electrode layer before the step of cutting, wherein the step of cutting is performed to cut said silicon carbide substrate at a dicing region that separates said portion covered with said insulating resin from another said portion covered with said insulating resin.

7. The method for producing a semiconductor apparatus according to claim 6, wherein said stress relaxation resin and said insulating resin contain identical types, respectively, of one of polyimide resin and polyimide-amide resin as a major component.

8. The method for producing a semiconductor apparatus according to claim 1, wherein said stress relaxation resin extends from a peripheral end portion of said semiconductor device uninterruptedly to also cover a section of said silicon carbide substrate.

9. A semiconductor apparatus comprising:
   a semiconductor device including a silicon carbide substrate having an exposed surface without an insulating layer;
   a lead member connected to an electrode layer of said semiconductor device;
   an electrically conductive member in a form of a plate containing copper as a major component and bonded to a first surface of said semiconductor device opposite a second surface of said semiconductor device having said electrode thereon; and
   a sealant resin containing epoxy resin as a major component and sealing said semiconductor device, said lead member, and said electrically conductive member,
   said semiconductor device having a covering layer of one of polyimide resin and polyamide-imide resin that covers only peripheral end portions of said second surface having said electrode thereon, and said covering layer being in contact with said exposed surface of said silicon carbide substrate without said insulating layer, and
   said covering layer being in contact with said sealant resin.

10. The semiconductor apparatus according to claim 9, wherein said sealant resin has a coefficient of linear expansion in a range of 10-17 ppm.

11. The semiconductor apparatus according to claim 9, wherein said electrically conductive member is in contact with said sealant resin.

12. The method for producing a semiconductor apparatus according to claim 1, further comprising:
   applying the stress relaxation resin to cover said exposed surface at only peripheral end portions so that a central portion of said exposed surface remains uncovered by said stress relaxation resin; and
   applying the sealant resin to be in direct contact with the central portion of said exposed surface.

13. The method for producing a semiconductor apparatus according to claim 1, further comprising:
   applying an insulating resin to cover a peripheral portion of each of said electrode layers,
   wherein the applying said stress relaxation resin further includes applying said stress relaxation resin to cover a peripheral portion of said insulating resin.

14. The semiconductor apparatus according to claim 9, further comprising:
   an insulating layer covering a peripheral portion of each of said electrode layers.

* * * * *